(12) United States Patent
Ben-Ayun et al.

(10) Patent No.: US 8,588,333 B2
(45) Date of Patent: Nov. 19, 2013

(54) RF TRANSMITTER AND METHOD OF OPERATION

(75) Inventors: Moshe Ben-Ayun, Shoham (IL); Ovadia Grossman, Tel Aviv-Yaffo (IL); Mark Rozental, Gedera (IL); Uri Vallach, Petach-Tikva (IL)

(73) Assignee: Motorola Solutions, Inc., Schaumburg, IL (US)

(*) Notice: Subject to any disclaimer, the term of this patent is extended or adjusted under 35 U.S.C. 154(b) by 475 days.

(21) Appl. No.: 12/886,684

(22) Filed: Sep. 21, 2010

(65) Prior Publication Data

US 2011/0007841 A1    Jan. 13, 2011

Related U.S. Application Data

(63) Continuation of application No. PCT/US2009/037676, filed on Mar. 19, 2009.

(30) Foreign Application Priority Data

Mar. 27, 2008  (GB) ................................. 0805566.7

(51) Int. Cl.
*H04K 1/02*  (2006.01)

(52) U.S. Cl.
USPC ........... 375/297; 375/295; 375/296; 330/149; 330/136; 455/126

(58) Field of Classification Search
USPC .................. 375/297, 295, 296; 330/149, 136; 455/126, 127
See application file for complete search history.

(56) References Cited

U.S. PATENT DOCUMENTS

| 5,722,056 A | 2/1998 | Horowitz et al. | |
| 5,748,037 A * | 5/1998 | Rozental et al. | 330/2 |
| 5,748,038 A * | 5/1998 | Boscovic et al. | 330/2 |

FOREIGN PATENT DOCUMENTS

| GB | 2287595 A | 9/1994 |
| GB | 2287371 A | 9/1995 |
| GB | 2329538 A | 9/1997 |

OTHER PUBLICATIONS

European Office Action mailed on Apr. 11, 2012 in counterpart European Patent Application No. 09723662.
European Office Action mailed on Mar. 31, 2011 in counterpart European Patent Application No. 09723662.
International Preliminary Report on Patentability dated Sep. 28, 2010 in counterpart International Application No. PCT/US2009/037676.
GB Office Action Dated Jul. 24, 2008.
PCT International Search Report Dated May 25, 2009.

* cited by examiner

*Primary Examiner* — Zewdu Kassa
(74) *Attorney, Agent, or Firm* — Valerie M. Davis; Kenneth A. Haas

(57) ABSTRACT

A linear RF transmitter (100) includes a forward path including a baseband signal combiner (109) and an RF (radio frequency) power amplifier (123), and a linearizing control loop from an output (127) of the RF power amplifier to an input of the combiner (109). A feedback control path (105, 107) of the loop delivers a baseband error control signal to the combiner. The transmitter further includes a test signal generator (102) to apply to the combiner in a closed loop level training mode a test signal comprising a voltage $V_{in}$ which increases with time in a non-linear manner approaching an asymptotic limit such that in response an output signal produced by the combiner is a voltage $V_e$ which is substantially constant over a period of time.

20 Claims, 3 Drawing Sheets

RF TRANSMITTER AND METHOD OF OPERATION

CROSS REFERENCE TO RELATED APPLICATIONS

This application is a continuation of International Application Serial No. PCT/US2009/037676 (the "PCT international application") filed on Mar. 19, 2009. This application claims priority to prior Great Britain (GB) national application having Serial No. 0805566.7 filed on Mar. 27, 2008, the priority of which was also claimed in the PCT international application. Both the PCT international application and the GB national application are assigned to Motorola, Inc.

TECHNICAL FIELD

The technical field relates to a radio frequency (RF) transmitter and a method of operation of the transmitter. In particular, the technical field relates to an RF transmitter including a linearity control loop and a method of operation of level training in the transmitter.

BACKGROUND

RF communication terminals normally employ an RF transmitter to generate RF signals, a receiver to receive RF signals and an antenna to send radiated signals produced by the transmitter over-the-air to another terminal and to receive signals sent over-the-air from another terminal for delivery to the receiver. The transmitter normally includes an RF power amplifier, 'RFPA', to amplify the RF signals before they are delivered to the antenna for transmission.

It is desirable for the RF transmitter to be linear, i.e. for the RFPA to produce a power amplification which is a linear function of the power of the input signal provided to it, in order to prevent distortion of the input signal and to minimize adjacent channel interference. Many RF transmitters include at least one control loop such as a Cartesian loop to provide linearization of the RFPA of the transmitter.

The control loop may be operated in a training mode to set a suitable strength level (of the baseband signal delivered along the forward path) which in operation does not cause compression of the RFPA.

The control loop may include a loop filter which may include one or more filter stages. One purpose of the loop filter is to constrain the bandwidth of the loop to ensure stability of the loop. In filter analysis, it well known to define such a filter in terms of the transfer function of the filter, especially parameters known as the poles and zeros which are obtained from the transfer function of the filter. For example, the transfer function H(s) of an LTI filter used as a loop filter may be defined as $H(s)=Y(s)/X(s)$ where the terms $Y(s)$ and $X(s)$ are polynomial expressions which can be factorised; the multiplying factors of the factorised expressions can be written in the form, $s-q_i$, where i is an integer, 1, 2, 3 .... The (possibly complex) numbers $q_i$ are the roots of the polynomial. When s is set to the value of any of these roots of the numerator polynomial term Y(s) which results in the transfer function evaluating to zero, the root in question is denoted as a 'zero'. When s is set to the value of any of the roots of the denominator polynomial term X(s) which results in the transfer function approaching infinity, the root in question is denoted as a 'pole'. The concept of zeros and poles will of course be familiar to those skilled in the art of designing filters.

The loop filter used in a control loop such as a Cartesian loop in a linear RF transmitter is normally designed to have a first pole at a low frequency and a second pole and a zero at higher frequencies. The precise positions in frequency of the first pole, the second pole and the zero are selected according to the properties of the RF signal that has to be transmitted by the transmitter. In some transmitters, the selection of these positions can lead to a serious problem during level training described above. The loop filter may no longer be a perfect integrator and this can cause difficulty in identifying during level training the appropriate strength level needed to avoid compression of the RFPA.

Thus, there exists a need for a linear RF transmitter, for use in mobile communications, which addresses at least some of the shortcomings of past and present techniques and/or procedures employed for level training in such transmitters.

BRIEF DESCRIPTION OF THE ACCOMPANYING DRAWINGS

The accompanying drawings, in which like reference numerals refer to identical or functionally similar items throughout the separate views which, together with the detailed description below, are incorporated in and form part of this patent specification and serve to further illustrate various embodiments of concepts that include the claimed invention, and to explain various principles and advantages of those embodiments.

Figure 1:
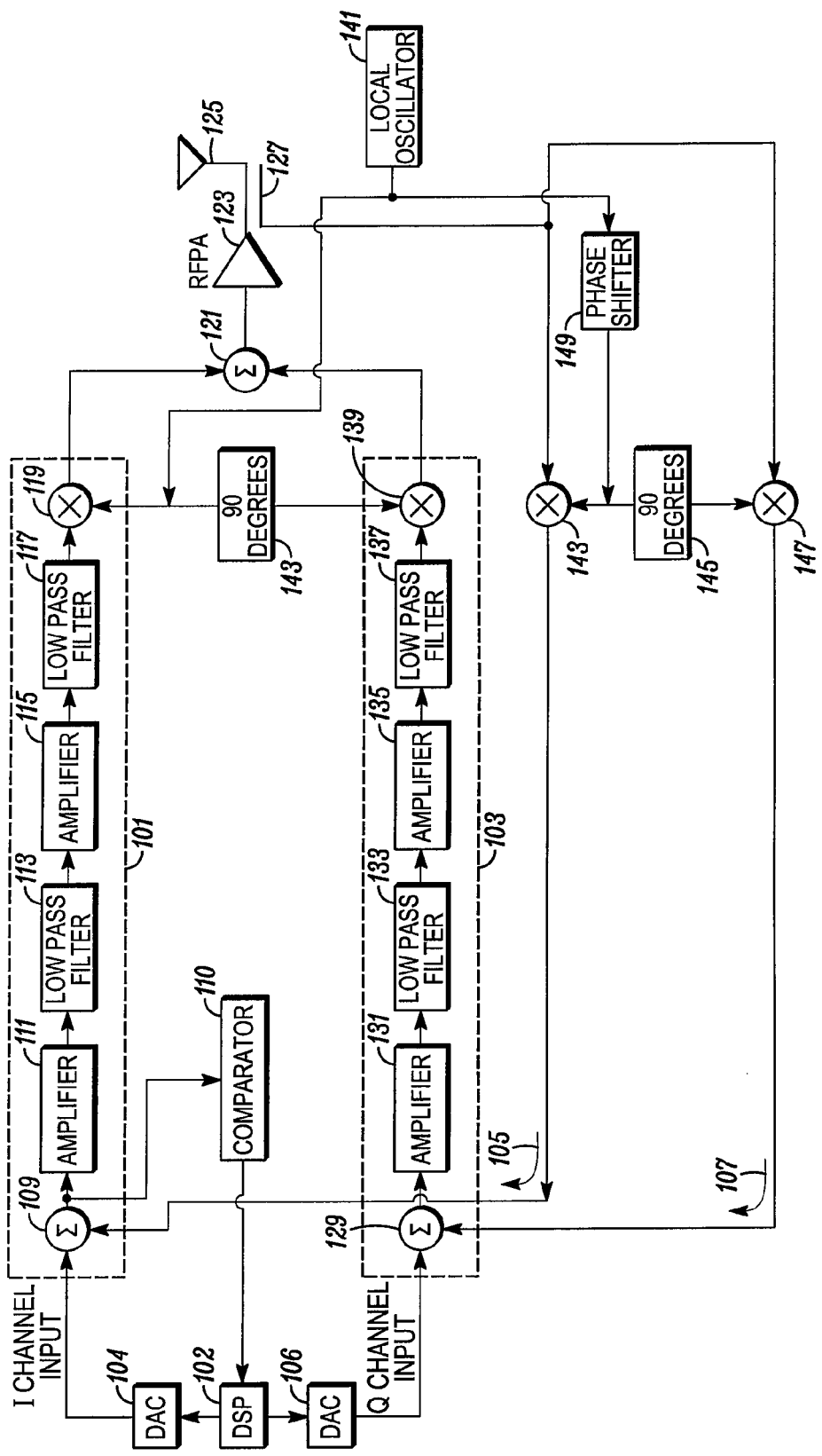
FIG. 1 is a block schematic diagram of an illustrative RF transmitter.

Skilled artisans will appreciate that items shown in the drawings are illustrated for simplicity and clarity and have not necessarily been drawn to scale. For example, the dimensions of some of the items may be exaggerated relative to other items to assist understanding of various embodiments. In addition, the description and drawings do not necessarily require the order illustrated. Apparatus and method components have been represented where appropriate by conventional symbols in the drawings, showing only those specific details that are pertinent to understanding the various embodiments so as not to obscure the disclosure with details that will be readily apparent to those of ordinary skill in the art having the benefit of the description herein. Thus, it will be appreciated that for simplicity and clarity of illustration, common and well-understood items that are useful or necessary in a commercially feasible embodiment may not be depicted in order to facilitate a less obstructed view of these various embodiments.

DETAILED DESCRIPTION

Generally speaking, pursuant to the various embodiments to be described, there is provided a linear RF transmitter including a forward path for receiving and processing in an operational mode an input baseband signal and for producing a modulated RF signal from the baseband signal, the forward path including a baseband signal combiner and an RF (radio frequency) power amplifier, a linearizing control loop including a coupling from an output of the RF power amplifier to an input of the combiner, wherein the control loop includes a feedback control path operable to deliver a baseband error control signal to the combiner, the transmitter further including a test signal generator operable to apply to the combiner in a closed loop level training mode a test signal comprising a voltage $V_{in}$ which increases with time in a non-linear manner approaching an asymptotic limit such that in response an output signal produced by the combiner is a voltage $V_e$ which is substantially constant over a period of time.

The voltage $V_{in}$ may vary with time t according to an inverse exponential relationship. As demonstrated later, the relationship may be defined as:

$$V_{in}(t) = k\beta A\left[1 - e^{-\frac{t}{\tau 1}}\right]$$

where e represents an exponential, τ1 represents a time constant of the first filter pole of the control loop, k represents a constant and βA represents a loop gain of the control loop, 'A' being the gain of the loop in the forward path and 'β' being the gain of the loop in the feedback path.

Applying the test signal in the non-linear form of $V_{in}$ as defined above allows the voltage $V_e$ developed in response at the output of the combiner, e.g. between the combiner and a loop low pass filter, to be substantially constant over a period of time.

Eventually, the test signal reaches a level at which the RFPA of the transmitter is driven into a condition of compression. At this level, the voltage $V_e$ begins to rise rapidly with time. Detection of this level of the test signal allows the onset of compression to be detected. By ensuring that the voltage $V_e$ is substantially constant in the period of time prior to the onset of compression in the level training mode, the onset of compression in that mode may be detected more accurately than in the prior art, thereby avoiding the possibility of a false detection of compression of the RFPA.

Furthermore, applying the test signal in the non-linear form of $V_{in}$ as defined above allows the voltage $V_e$ developed in response to remain substantially constant even when the control loop includes a low pass filter having a first filter pole at a frequency which is substantially higher than zero Hertz, e.g. at least 1 kHz. Such a control loop may suitably be employed in a transmitter for transmitting a signal having a wideband modulation, e.g. a modulation band wider than 25 kHz, such as a signal in accordance with the TETRA 2 standard, the HPD (High Performance Data) protocol, the HSD (High Speed Data) protocol or the WiMax protocol.

Those skilled in the art will appreciate that these recognized benefits and advantages and other advantages described herein are merely illustrative and are not meant to be a complete rendering of all of the benefits and advantages of the various embodiments of the invention.

Referring now to the accompanying drawings, and in particular to FIG. 1, there is shown a block schematic diagram of an illustrative RF transmitter 100. The transmitter 100 includes a Digital Signal Processor (DSP) 102 coupled to a Digital to Analog Converter (DAC) 104 and a Digital to Analog Converter (DAC) 106. The DSP 102 serves as a generator of a baseband signal in an operational mode and a generator of a test signal in a training mode. The DSP 102 is thus an illustration of the 'test signal generator' referred to herein. In an operational mode, the DSP 102 produces a baseband digital output 'I' signal component which is converted into analog form by the DAC 104. The DSP 102 also produces a baseband digital output 'Q' signal component which is converted into analog form by the DAC 106.

An output signal produced by the DAC 104 is delivered as a baseband I channel input signal to an I (In-phase) channel 101 of a forward signal delivery path which extends eventually to an antenna 125. An output signal produced by the DAC 106 is delivered as a baseband Q channel input signal to a Q (Quadrature phase) channel 103 of the forward path.

The I channel 101 includes a combiner 109 which may be a differential summer. The combiner 109 is a baseband signal combiner which receives as a first input signal the I channel input signal from the DAC 104. The combiner 109 also receives as a second input signal an error control signal from an I feedback control channel 105. The combiner 109 produces an output signal which is a differential sum of (difference between) its first and second input signals. The output signal produced by the combiner 109 is applied in turn to an amplifier 111, a low pass filter 113, a further amplifier 115 and a further low pass filter 117. The amplifiers 111 and 115 provide optional gain stages in the I channel 101. The low pass filter 113 sets a first filter pole of a complete negative feedback control loop which includes the I feedback control channel 105. The control loop is described in more detail later. The low pass filter 117 sets a second filter pole and a zero of the complete control loop.

The Q channel 103 includes a combiner 129 which may be a differential summer 129. The combiner 129 is a baseband signal combiner which receives as a first input signal the Q channel input signal from the DAC 106. The combiner 129 also receives as a second input signal an error control signal from a feedback control channel 107. The combiner 129 produces an output signal which is a differential sum of its first and second input signals. The output signal produced by the combiner 129 is applied in turn to an amplifier 131, a low pass filter 133, a further amplifier 135 and a further low pass filter 137.

The amplifiers 131 and 135 provide optional gain stages in the Q channel 103. The low pass filter 133 sets a first filter pole of a complete negative feedback control loop which includes the feedback control channel 107. The control loop is described in more detail later. The low pass filter 137 sets a second filter pole and a zero of the complete control loop. Either or both of the low pass filters 137 and 117 may be programmable.

The first pole, the second pole and the zero of the control loops that include the feedback control channels 105 and 107 may have the same respective values in the two loops including, respectively, the I channel 101 and the Q channel 103.

The first filter pole of each loop may be set at a frequency of at least 1 kHz, e.g. at a frequency of about 3 kHz, to suit wideband modulation operation of the transmitter 100. The same first filter pole setting may be used for different applications of the transmitter 100, e.g. for use of the transmitter 100 alternatively in a TETRA 1 system or terminal and in a TETRA 2 system or terminal as defined later.

The second filter pole and zero may be at frequency settings which depend on the particular application and implementation of the transmitter 100. The settings may be at different frequencies for different applications of the transmitter 100. Illustratively, the second pole may set at a frequency of about 25 kHz for use in a TETRA 1 system and at a frequency of about 108 kHz for use in a TETRA 2 system. Illustratively, the zero may be set to be at a frequency of about 250 kHz for use in a TETRA 1 system and a frequency of about 1 MHz for use in a TETRA 2 system.

A mixer 119 in the I channel 101 receives a baseband signal produced by the low pass filter 117. The mixer 119 upconverts the baseband signal to an RF carrier frequency by mixing the baseband signal with a carrier frequency signal applied to the mixer 119. The carrier frequency signal is produced by a local oscillator 141.

Similarly, a mixer 139 in the Q channel 103 receives an output baseband signal produced by the low pass filter 137. The mixer 139 converts the baseband signal to an RF carrier frequency by mixing the baseband signal with a carrier frequency signal applied to the mixer 139. The carrier frequency signal is a signal produced by the local oscillator 141 and delivered to the mixer 139 via a phase shifter 143 which shifts the phase of the signal by ninety degrees.

The mixer 119 and the mixer 139 respectively produce RF output signals which are applied as input signals to a summer 121. The summer 121 adds the input component signals applied to it to produce a combined RF output signal which is applied to an RF power amplifier (RFPA) 123 and is amplified by the RFPA 123. An amplified output signal produced by RFPA 123 is delivered to the antenna 125 for sending by wireless communication to at least one remote receiver (not shown).

The transmitter 100 may be part of a transceiver which includes a receiver (not shown). In that case, an antenna switch or duplexer or the like (not shown) may be located between the RFPA 123 and the antenna 125 to allow the RFPA 123 to be isolated from the antenna 125 and the receiver when the antenna 125 and the receiver are operating together in a receiving mode.

A coupler 127, e.g. a directional coupler, at an output of the RFPA 123 serves as a sampler to sample the amplified RF output signal produced by the RFPA 123. The sampled RF signal is applied as a first input signal to a mixer 143 in the I feedback control channel 105 and as a first input signal to a mixer 147 in the Q feedback control channel 147. The mixer 143 also receives a second input which is the signal produced by the local oscillator 141 via a phase shifter 149. The mixer 147 also receives a second input signal which is the signal produced by the local oscillator 141 delivered to the mixer 147 via the phase shifter 149 and a phase shifter 145. The phase shifter 145 shifts the phase of the signal applied to it by ninety degrees. The phase shifter 149 applies adjusting shifts to the phase of the signal from the local oscillator 141 when required during a phase training mode of the transmitter 100 as described in more detail later.

The mixer 143 produces, by downconverting the frequency of the RF signal applied to it, a baseband I error control signal which is applied to the combiner 109. Similarly, the mixer 147 produces, by downconverting the frequency of the RF signal applied to it, a baseband Q error signal which is applied to the combiner 129. As mentioned earlier, the error control signals applied respectively to the combiner 109 and the combiner 129 are differentially added to (subtracted from) the I channel input signal and the Q channel input signal, respectively.

Thus, the linearizing control loop (Cartesian loop) of the transmitter 100 comprises: the 'I' loop extending from the combiner 109 via the I channel 101 to the coupler 127 and from the coupler 127 via the I feedback control channel 105 to the combiner 109; and the 'Q' loop extending from the combiner 129 via the Q channel 103 to the coupler 127 and from the coupler 127 via the Q feedback control channel 107 to the combiner 129. The feedback control path of the control loop comprises: the part of the 'I' loop extending from the coupler 127 via the I feedback control channel 105 to the combiner 109; and the part of the 'Q' loop extending from the coupler 127 via the Q feedback control channel 107 to the combiner 129.

As will be apparent to those skilled in the art, the I feedback control channel 105 and the Q feedback control channel 107 may each include one or more filters (not shown) and one or more amplifiers (not shown).

The transmitter 100 has an operational mode in which the transmitter 100 generates and sends RF signals in a usual manner. The transmitter 100 also has at least one training mode including a level training mode. The transmitter 100 may also include a phase training mode. The training mode(s) may be applied at selected times, e.g. at regular intervals between periods when the operational mode is applied. The intervals employed for the training mode(s) may be those defined in a protocol according to which the transmitter is operating. For example, where the transmitter 100 operates according to the TETRA 1 standard, the intervals may correspond to time slots of the TETRA timing protocol which are set aside for transmitter linearizing purposes, namely slots known as the Common Linearisation Channel (CLCH).

During each operation of the level training mode, the control loop comprising: (i) the I channel 101 of the forward path and the I feedback control channel 105; and (ii) the Q channel 103 of the forward path and the feedback control channel 107; operates in a closed loop mode. The DSP 102 generates a test signal which is applied to either or both of the I channel 101 and the Q channel 103. The purpose of applying the test signal in the level training mode is to detect a compression point or condition of the RFPA 123 when the operation of the RFPA 123 (in terms of its output power as a function of its input power) becomes non-linear.

Figure 2:
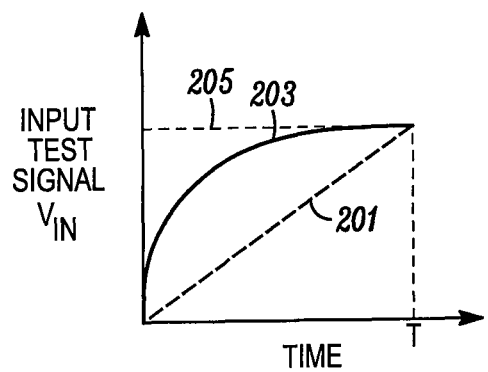
FIG. 2 is a graph of a level plotted against time of an input test signal used in the transmitter of FIG. 1, illustrating a suitable waveform of the test signal.

FIG. 2 is a graph 200 showing a plot 203 in which a level of the input test signal when applied to the combiner 109 or the combiner 129 or both is plotted against time. This input signal is referred to herein as a signal $V_{in}$. The signal $V_{in}$ comprises a voltage waveform. The plot 203 which describes the applied voltage waveform of the input test signal $V_{in}$ has a shape which is curved rather than straight as indicated for comparison purposes by a dashed straight line 201 representing a conventional test signal. The plot 203 has an inverse exponential form explained in more detail later. As the level of the test signal $V_{in}$ in the plot 203 increases, the level approaches an asymptotic limit indicated by a dashed horizontal line 205. The level of the test signal $V_{in}$ reaches a practical maximum at a time T. The shape of the plot 203 is selected so that a desired combined signal $V_e$ developed in response at the output of the combiner 109 and/or at the output of the combiner 129 (depending on where $V_{in}$ is applied) is substantially constant with time.

Figure 3:
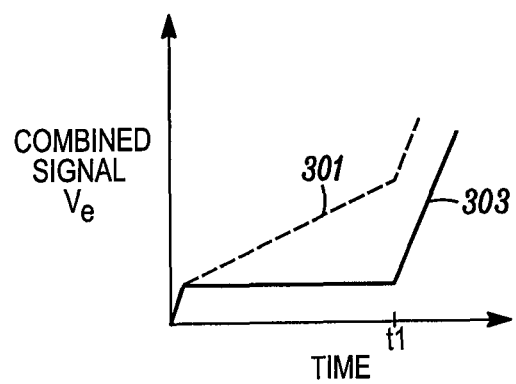
FIG. 3 is graph of a level plotted against time of a combined signal produced by a combiner of a forward path of the transmitter of FIG. 1, the graph illustrating a suitable response of the combined signal to application of the test signal illustrated in FIG. 2.

FIG. 3 is a graph 300 of the combined signal $V_e$ plotted against time showing a plot 303 which represents the desired form of the combined signal $V_e$. The combined signal $V_e$ is another voltage waveform. The plot 303 has, until a time t1, a substantially horizontal portion in which the level of the combined signal $V_e$ is substantially constant with time. When the input test signal $V_{in}$ reaches a particular level at the time t1, the compression point of the RFPA 123 is reached causing the combined signal $V_e$ indicated by the plot 303 to increase steeply with time.

For comparison purposes, FIG. 3 also shows a dashed plot 301 which corresponds to the combined signal obtained using an input test signal having the conventional straight line form indicated by the line 201 in FIG. 2. Although the plot 301 has an increase in gradient at the time t1, the plot 301 undesirably shows an increase with time throughout the duration of the input test signal making detection of the compression point inaccurate. Such detection can be made in error before the RFPA 123 is driven into compression.

The combined signal $V_e$, as represented by the plot 303, produced by the combiner 109 or by the combiner 129 or both, is monitored by a detector to detect a point on the plot 303 when the plot 303 begins to rise steeply at the time t1 indicating that the RFPA 123 compression point has been reached. For example, as shown in FIG. 1, the combined signal $V_e$ when produced by the combiner 109 may be applied to a comparator 110 in which it is compared with a reference signal. The level of the reference signal may be selected to be equivalent to an instant in time when the RFPA 123 reaches a specified point of compression on its power transfer characteristic. The level selected will depend on the particular implementation conditions employed. An illustrative value of the level is for example about 90 mV for a transmitter of a TETRA mobile terminal.

The comparator 110 produces an output indication signal when the level of the combined signal $V_e$ reaches the level of the reference signal. The output indication signal is applied to the DSP 102. The DSP 102 correlates the instant of time when the output indication signal is produced by the comparator 110 with a particular level of the input test signal $V_{in}$ which was provided by the DSP 102 and which caused the production of the output indication signal. The DSP 102 is able therefore to detect a corresponding level of the input test signal $V_{in}$ at which the RFPA 123 is driven into compression. In response, the DSP 102 sets a level (amplitude) for output baseband signals to be produced by the DSP 102 in the next period of the operational mode. The level is chosen to be a suitable margin below the level detected to cause compression of the RFPA 123.

As known in the art, the transmitter 100 may have a phase training mode which may conveniently be applied prior to the level training mode, e.g. in the same training interval in which each application of the level training mode is made. In the phase training mode, the control loop including the feedback control channels 105 and 107 is operated in an open loop mode to determine in a known manner a correct phase for stable operation of the control loop. The result of phase training is programmed to the phase shifter 149 to apply a suitable phase shift. The phase shift so set is applied in the next period of the operational mode with the control loop operating in closed loop mode.

An illustrative analysis of the transmitter 100 which supports the use of the input test signal $V_{in}$ having the form of the plot 203 shown in FIG. 2 is as follows.

For ideal application of the level training mode, the first filter pole of the control loop comprising the I feedback control channel 105 and the I channel 101 of the forward path and/or the Q feedback channel 107 and the Q channel 103 of the forward path is at a frequency of zero so that the first pole acts properly as an integrator. However, when the first filter pole of the control loop is at a frequency significantly greater than zero, such as at an illustrative frequency of at least 1 kHz, e.g. at a frequency of 3 kHz as produced by the low pass filters 113 and 133, the first pole is no longer an integrator.

The combined signal $V_e$ provides (after amplification by the amplifier 111 or the amplifier 133 as appropriate) an input to the filter providing the first pole of the control loop, i.e. the low pass filter 113 or the low pass filter 133 as appropriate. The combined signal $V_e$ provides a suitable baseband signal to monitor to detect compression of the RFPA 123. The combined signal $V_e$ is related to the input test signal $V_{in}$ applied in the appropriate forward channel, e.g. the I channel 101, by the relationship:

$$Ve = Vin * \frac{1}{\beta A} \qquad \text{(Equation 1)}$$

where $\beta A$ is the Cartesian feedback loop gain.

Where the first loop filter pole is a perfect integrator, applying $V_{in}$ in the form of a straight line ramp, as indicated by the line 201 in FIG. 2, will produce in response a form of the combined signal $V_e$ which does not increase with time during the linear operation of the RFPA 123, i.e. before the compression point of the RFPA 123.

However, where the first pole is not a perfect integrator, for example at a frequency of at least 1 kHz, such as a frequency of about 3 kHz, then applying Vin in the form of a straight line ramp, as indicated by the line 201 in FIG. 2, will produce a form of Ve which is not constant. By assuming that the first loop filter pole is dominant and the second loop filter pole and zero can be neglected, it can be shown that $V_e(t)$ and time t have the approximate relationship:

$$V_e(t) \approx \frac{a}{\beta A} t \qquad (2)$$

In other words, where the first pole is not a perfect integrator and $V_{in}$ is applied in the form of a straight line ramp, $V_e(t)$ is rising as a function of time as illustrated by the plot 301 shown in FIG. 3, where α is a constant (the angle of the lower part of the plot 301 relative to the horizontal time axis). It has been found that this form of $V_e(t)$ can lead to errors in detection of the compression point of the RFPA 123.

In order to calculate $V_{in}$ as a function of time, i.e. $V_{in}(t)$, so that $V_e(t)$ remains constant, the Laplace transform $V_e(s)$ of $V_e(t)$ may be considered. The Laplace transform $V_e(s)$ is given by:

$$V_e(s) = \frac{k}{s} = \frac{\tau 1}{\beta A}\left[s + \frac{1}{\tau 1}\right] V_{in}(s) \qquad \text{(Equation 3)}$$

where $V_{in}(s)$ is the Laplace transform of $V_{in}(t)$. Rearranging Equation 3 gives:

$$V_{in}(s) = \frac{k\beta A}{\tau 1}\left[\frac{1}{s + \frac{1}{\tau 1}}\right]\frac{1}{s} = G(s)\frac{1}{s} \qquad \text{(Equation 4)}$$

where $$G(s) = \frac{k\beta A}{\tau 1}\left[\frac{1}{s + \frac{1}{\tau 1}}\right] \qquad \text{(Equation 5)}$$

k is a constant and $\beta A$ and $\tau 1$ are as defined earlier. The inverse Laplace transform of G(s), G(t), can be obtained as follows. Using the property of Laplace transformation, if $$V_{in}(s) = G(s)\frac{1}{s}$$

then:

$$V_{in}(t) = \int_0^t G(t)\,dt \quad \text{(Equation 6)}$$

Inverse Laplace transformation of G(s) defined in Equation 5 thus allows G(t) to be obtained as follows:

$$G(t) = \frac{k\beta A}{\tau 1} e^{-\frac{t}{\tau 1}} \quad \text{(Equation 7)}$$

Thus, substituting the value of G(t) given in Equation 7 into Equation 6 gives:

$$V_{in}(t) = \frac{k\beta A}{\tau 1}\int_0^t e^{-\frac{t}{\tau 1}}\,dt = k\beta A\left[1 - e^{-\frac{t}{\tau 1}}\right] \quad \text{(Equation 8)}$$

Thus, the function defined by Equation 8 represents the form of the voltage waveform required for the test signal $V_{in}(t)$ to produce a constant value of the combined voltage $V_e$ until the RFPA 123 is driven into compression.

The maximum value $V_{in\_max}$ of the applied waveform of the test signal $V_{in}(t)$ should be high enough to drive the RFPA 123 into compression during the level training mode. $V_{in\_max}$ is given by:

$$V_{in\_max} = k\beta A = \beta V_{out\_max} \quad \text{(Equation 9)}$$

where $V_{out\_max}$ is the maximum RMS level in Volts of the signal produced by the RFPA 123. For a TETRA transmitter, the output power needs to reach 6 Watts during level training as specified by the TETRA standard. This is equivalent to an RMS value of $V_{out\_max}$ of about 17 Volts. In addition, in an illustrative example, $\beta=-50$ dB=1/316, k is 30 millivolts and A is 67 dB. Using these values gives an illustrative maximum value $V_{in\_max}$ of the applied waveform $V_{in}(t)$ of about 0.22 Volt. Thus, the maximum level of $V_{in}(t)$ when of the form illustrated by plot 203 may be selected to be a suitable value, e.g. in a range between about 0.1 Volt and about 1.0 Volt, especially between about 0.1 Volt and 0.5 Volt.

A suitable value of the required duration of the applied waveform $V_{in}(t)$ having the form of the plot 203 in FIG. 3 may be a duration in the range of from about 100 microseconds to about 300 microseconds. An illustrative calculation of the duration is as follows. It is known that for an exponential function having the form defined by Equation 8, the exponential function reaches 95 percent of its final value (the asymptote 205) when the time has reached a value $t=3\tau 1$. Thus, the duration may be set as a suitable time longer (e.g. at least 105 percent longer) than $t=3\tau 1$. As noted earlier, if for example the first filter pole of the control loop has a frequency of 3 kHz, then $t=3\tau 1$ has a value of about 159 microseconds. So, for the case where the first pole has a frequency of 3 kHz, the duration of the waveform of the test signal $V_{in}(t)$ may be a suitable time not less than about 165 microseconds. Typically, the duration may be selected to be a time of between about 100 microseconds and about 300 microseconds, such as a time of about 200 microseconds.

Figure 4:
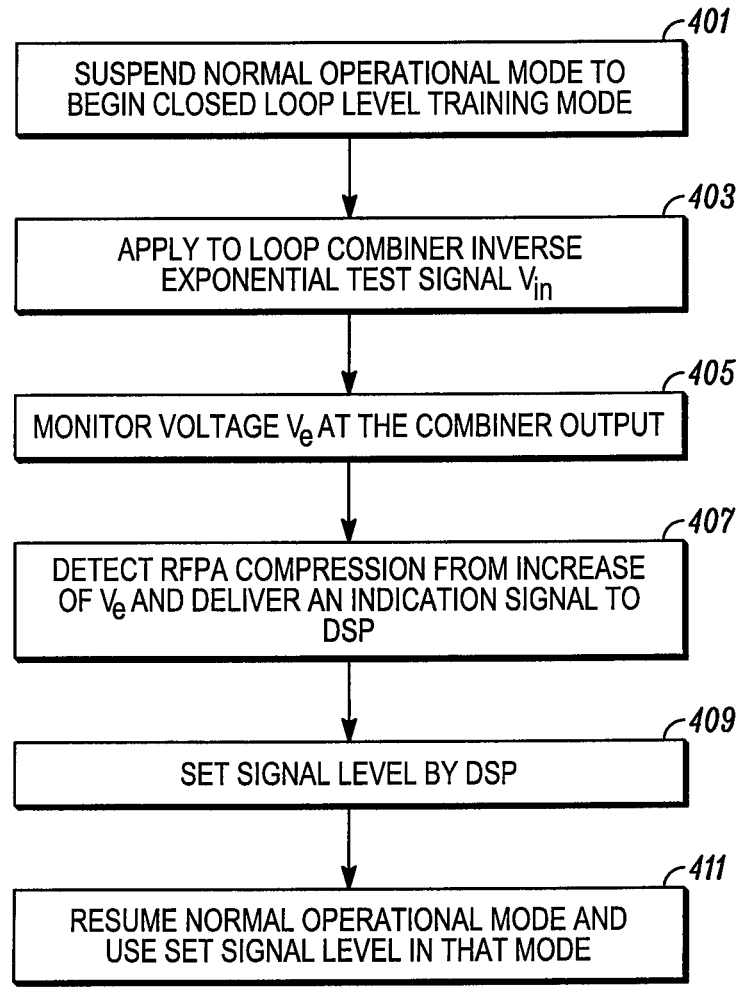
FIG. 4 is a flow chart of an illustrative method of operation of the RF transmitter of FIG. 1.

FIG. 4 is a flow chart of a method 400 which summarises operation of the transmitter 100 in the embodiments described above.

At 401 of the method 400, a normal operational mode of the transmitter 100 is suspended and a closed loop training mode is begun. This may be at the start of an interval set aside for the training mode. For example where the transmitter 100 is a TETRA transmitter, the interval may be a time frame set aside for such training as defined by the TETRA standard.

At 403, a test signal generated by the DSP 102 is applied as an I channel input signal to the combiner 109 and/or as a Q channel input signal to the combiner 129. The test signal is a voltage waveform $V_{in}$ having the inverse exponential form represented by Equation 8 given earlier.

At 405 which is carried out in conjunction with 403, a voltage $V_e$ developed at the output of the combiner 109 and/or the combiner 129 as appropriate is monitored. The voltage $V_e$ has, as a function of time, the form of the plot 303 shown in FIG. 3.

At 407, compression of the RFPA 123 is detected, e.g. by the comparator 110, from an increase in $V_e$, and an indication signal is sent to the DSP 102.

In response to receiving the indication signal, the DSP 102 determines the voltage level of $V_{in}$ at which the RFPA 123 was driven into compression and accordingly, at 409, sets a signal level for baseband signals generated by the DSP 102 to avoid compression of the RFPA 123. The DSP 102 may use the time indicated by the delivered signal, i.e. the time of issue of the delivered signal, to identify a point in time on the test signal comprising the voltage waveform $V_{in}$ when the signal level is at suitable level for selection.

Finally, the normal operational mode of the transmitter 100 is resumed at 411, and the DSP 102 uses the signal level set in the level training mode for signals produced by the DSP 102 in the normal operational mode.

The transmitter 100 and the method 400 are suitable for use in: (i) in a narrow band communication terminal such as a terminal operating according to the basic TETRA (TETRA 1) standard defined by the European Telecommunications Standards Institute, in which the transmitted signal will have a relatively narrow 25 kHz modulation bandwidth; the first pole of the loop filter may be selected accordingly to be at or near to a frequency of zero Hertz; and also in: a communication terminal having a wider modulation band, e.g. in a TETRA 2 terminal operating according to the TETRA 2 (TETRA Enhanced Data Services) standard defined by ETSI having a modulation bandwidth of up to 150 kHz; the position of the loop filter first pole in such a terminal is desirably shifted to a higher frequency, e.g. a frequency of at least 1 kHz, e.g. about 3 kHz. The transmitter 100 may be a dual- or multi-mode transmitter which operates in different selected modes (e.g. TETRA 1 and TETRA 2) in the same terminal.

In the foregoing specification, specific embodiments have been described. However, one of ordinary skill in the art will appreciate that various modifications and changes can be made without departing from the scope of the invention as set forth in the accompanying claims. Accordingly, the specification and drawings are to be regarded in an illustrative rather than a restrictive sense, and all such modifications are intended to be included within the scope of present teachings. The benefits, advantages, solutions to problems, and any element(s) that may cause any benefit, advantage, or solution to occur or become more pronounced are not to be construed as critical, required, or essential features or elements of any or all the claims. The invention is defined solely by the appended claims including any amendments made during the pendency of this patent application and all equivalents of those claims as issued.

Moreover in this document, relational terms such as 'first' and 'second', 'top' and 'bottom', and the like, may be used solely to distinguish one entity or action from another entity or action without necessarily requiring or implying any actual such relationship or order between such entities or actions. The terms 'comprises', 'comprising', 'has', 'having', 'includes', 'including', 'contains', 'containing' or any other variation thereof, are intended to cover a non-exclusive inclusion, such that a process, method, article, or apparatus that comprises, has, includes or contains a list of elements does not include only those elements but may include other elements not expressly listed or inherent to such process, method, article, or apparatus. An element preceded by 'comprises . . . a', 'has . . . a', 'includes . . . a', or 'contains . . . a' does not, without more constraints, preclude the existence of additional identical elements in the process, method, article, or apparatus that comprises, has, includes, contains the element. The terms 'a' and 'an' are defined as one or more unless explicitly stated otherwise herein.

The terms 'substantially', 'essentially', 'approximately', 'about' or any other version thereof, are defined as being close to as understood by one of ordinary skill in the art, and in one non-limiting embodiment the term is defined to be within 10%, in another embodiment within 5%, in another embodiment within 1% and in another embodiment within 0.5%, of a stated value. It is to be noted that these expressions may be used herein to indicate that a value obtained in practice may be different from a nominal target value because of the imprecise nature of implementing a circuit in which the value applies.

The term 'coupled' as used herein is defined as connected, although not necessarily directly and not necessarily mechanically. A device or structure that is 'configured' in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for synchronization in a digital mobile communication system as described herein. The non-processor circuits may include, but are not limited to, a radio receiver, a radio transmitter, signal drivers, clock circuits, power source circuits, and user input devices. As such, these functions may be interpreted as steps of a method to perform the synchronization in a digital mobile communication system as described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Both the state machine and ASIC are considered herein as a 'processing device' for purposes of the foregoing discussion and claim language.

Moreover, an embodiment including a memory can be implemented as a computer-readable storage element having computer readable code stored thereon for programming a computer (e.g., comprising a processing device) to perform a method as described and claimed herein. Examples of such computer-readable storage elements include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory.

Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separately claimed subject matter.

The invention claimed is:

1. A linear RF transmitter including a forward path for receiving and processing in an operational mode an input baseband signal and for producing a modulated RF signal from the baseband signal, the forward path including a baseband signal combiner and an RF (radio frequency) power amplifier, a linearizing control loop including a coupling from an output of the RF power amplifier to an input of the combiner, wherein the control loop includes a feedback control path operable to deliver a baseband error control signal to the combiner, the transmitter further including a test signal generator operable to apply to the combiner in a closed loop level training mode a test signal comprising a voltage waveform $V_{in}$ which increases with time in a non-linear manner approaching an asymptotic limit such that in response an output signal produced by the combiner is a voltage $V_e$ which is substantially constant over a period of time.

2. The transmitter according to claim 1, wherein the voltage waveform $V_{in}$ varies with time t according to an inverse exponential relationship given by $$V_{in}(t) = k\beta A\left[1 - e^{-\frac{t}{\tau 1}}\right]$$

where e represents an exponential, τ1 represents a time constant of a filter first pole of the control loop, k represents a constant and βA represents a loop gain of the control loop.

3. The transmitter according to claim 1 wherein the test signal generator is operable to apply the test signal to a voltage level which causes, in response, operation of the RF power amplifier to reach a condition of compression and the voltage $V_e$ to rise with time.

4. The transmitter according to claim 3 including a detector operable to monitor the voltage $V_e$ to detect a change in the voltage $V_e$ when the voltage $V_e$ rises with time after being substantially constant with time.

5. The transmitter according to claim 4 wherein the detector comprises a voltage comparator operable to compare the voltage $V_e$ with a reference voltage.

6. The transmitter according to claim 4 including a baseband signal generator for producing the baseband signal, wherein the detector is operable to provide to the baseband signal generator a signal indicating the detected change in the voltage $V_e$ and the baseband signal generator is operable to use the signal provided to set a level of the baseband signal in an operational mode of the transmitter.

7. The transmitter according to claim 1 including a low pass filter operable to provide a loop filter first pole of the control loop and to receive a baseband signal produced by the combiner, the voltage $V_e$ providing an input to the low pass filter in the level training mode.

8. The transmitter according to claim 1 wherein the forward path includes: (i) an I channel for receiving and processing an I component of the baseband signal, the I channel including a first mixer for upconverting the I component to produce an RF signal modulated by the I component, and (ii) a Q channel for receiving and processing a Q component of the baseband signal, the Q channel including a second mixer for upconverting the Q component to produce an RF signal modulated by the Q component; and the feedback control path includes: (i) an I feedback channel for delivering an I component of the error control signal, the I feedback channel including a third mixer for downconverting a sampled RF signal produced by the RF power amplifier to produce the I component of the error control signal; and (ii) a Q feedback channel for delivering a Q component of the error control signal, the Q feedback channel including a fourth mixer for downconverting a sampled RF signal produced by the RF power amplifier to produce the Q component of the error control signal.

9. A method of operation of a linear RF transmitter including an RF power amplifier including applying a closed loop level training mode which includes applying to a baseband signal combiner in a forward path of a linearizing control loop of the transmitter a test signal comprising a voltage waveform $V_{in}$ which increases with time in a non-linear manner approaching an asymptotic limit, developing in response a voltage $V_e$ as an output of the combiner which is substantially constant over a period of time, monitoring the voltage $V_e$ with time and detecting a rise in the voltage $V_e$ following the period in which voltage $V_e$ is substantially constant indicating that operation of the RF power amplifier has reached a condition of compression.

10. The method according to claim 9 further including delivering, in response to the detection, a signal to a digital signal processor indicating that operation of the RF power amplifier has reached a condition of compression.

11. The method according to claim 10 including setting by the digital signal processor a baseband signal level using a time indicated by the delivered signal.

12. The method according to claim 11 wherein the test signal is produced by the digital signal processor and includes the digital signal processor using the time indicated by the delivered signal to identify a point in time on the test signal when the signal level is at suitable level for selection.

13. The method according to claim 11 which includes the digital signal processor producing a baseband signal in an operational mode at a level selected in the level training mode.

14. The method according to claim 9 wherein the voltage waveform $V_{in}$ varies with time t according to an inverse exponential relationship given by $$V_{in}(t) = k\beta A\left[1 - e^{-\frac{t}{\tau 1}}\right]$$

where e represents an exponential, τ1 represents a time constant of a filter first pole of the control loop, k represents a constant and βA represents a loop gain of the control loop.

15. The method according to claim 9 which includes detecting a change in the voltage waveform $V_e$ by a detector comprising a voltage comparator which compares the voltage $V_e$ with a reference voltage.

16. The method according to claim 9 which is operated using a low pass filter in the linearizing control loop providing a loop filter first pole at a frequency of at least 1 kiloHertz.

17. The method according to claim 16 wherein the loop filter first pole has a time constant τ1 of less than about 100 microseconds.

18. The method according to claim 16 including applying the test signal for a duration which is greater than three times the time constant τ1 of the first pole of the low pass filter.

19. The method according to claim 18 including applying the test signal for a duration of between about 100 microseconds and about 300 microseconds.

20. The method according to claim 9 including applying the test signal in the level training mode at regular intervals between periods when the transmitter is operating in an operational mode.

\* \* \* \* \*